(12) United States Patent
Zhan (10) Patent No.: US 11,189,691 B2
(45) Date of Patent: Nov. 30, 2021

(54) METHOD OF MANUFACTURING SEMICONDUCTOR DEVICE

(71) Applicant: United Microelectronics Corp., Hsinchu (TW)

(72) Inventor: Zhaoyao Zhan, Singapore (SG)

(73) Assignee: UNITED MICROELECTRONICS CORP., Singapore (SG)

( * ) Notice: Subject to any disclaimer, the term of this patent is extended or adjusted under 35 U.S.C. 154(b) by 195 days.

(21) Appl. No.: 16/700,504

(22) Filed: Dec. 2, 2019

(65) Prior Publication Data

US 2021/0167170 A1    Jun. 3, 2021

(51) Int. Cl.

| | |
|---|---|
| H01L 29/06 | (2006.01) |
| H01L 21/265 | (2006.01) |
| H01L 29/66 | (2006.01) |
| H01L 21/306 | (2006.01) |
| H01L 21/762 | (2006.01) |
| H01L 29/423 | (2006.01) |
| H01L 29/10 | (2006.01) |
| H01L 29/08 | (2006.01) |

(52) U.S. Cl.
CPC .... *H01L 29/0673* (2013.01); *H01L 21/26513* (2013.01); *H01L 21/26546* (2013.01); *H01L 21/30604* (2013.01); *H01L 21/30612* (2013.01); *H01L 21/76224* (2013.01); *H01L 29/0847* (2013.01); *H01L 29/1033* (2013.01); *H01L 29/42392* (2013.01); *H01L 29/6656* (2013.01); *H01L 29/66522* (2013.01); *H01L 29/66545* (2013.01); *H01L 29/66742* (2013.01); *H01L 29/66795* (2013.01)

(58) Field of Classification Search
CPC ........... H01L 29/42392; H01L 29/0673; H01L 21/26533; H01L 21/26513; B82Y 10/00
See application file for complete search history.

(56) References Cited

U.S. PATENT DOCUMENTS

| | | | |
|---|---|---|---|
| 8,728,885 B1 * | 5/2014 | Pham | H01L 29/42392 438/176 |
| 2019/0067435 A1 | 2/2019 | Badaroglu et al. | |

* cited by examiner

*Primary Examiner* — Cuong Q Nguyen
*Assistant Examiner* — Peter M Albrecht
(74) *Attorney, Agent, or Firm* — J.C. Patents (57) ABSTRACT

A method of manufacturing a semiconductor device including following steps is provided. A substrate is provided. An ion implantation process is performed on the substrate to form doped material layers at different depth positions of the substrate and to define at least one nanowire layer. The at least one nanowire layer and the doped material layers are alternately stacked. A patterning process is performed on the at least one nanowire layer and the doped material layers to form at least one nanowire and doped layers. The at least one nanowire and the doped layers are alternately stacked to form a stack structure. A dummy gate structure spanning over the stack structure is formed. Spacers located on sidewalls of the dummy gate structure is formed. The dummy gate structure is removed to expose the at least one nanowire and the doped layers. The exposed doped layers are removed to form openings.

20 Claims, 13 Drawing Sheets

METHOD OF MANUFACTURING SEMICONDUCTOR DEVICE

BACKGROUND OF THE INVENTION

Field of the Invention

The invention relates to a manufacturing method, and particularly relates to a method of manufacturing a semiconductor device.

Description of Related Art

In order to increase the density of semiconductor devices, transistors having a gate-all-around (GAA) structure have been proposed. Such a GAA structure may include nanowires and a gate structure surrounding the nanowires. Since transistors having such a GAA structure use a three-dimensional channel, the transistors may have a reduced scale. Further, the transistor may achieve an improved current control ability and suppress the short channel effect.

The current process for forming nanowires is to epitaxially grow a Si/SiGe stack structure and then remove the SiGe. However, the above-described nanowire process is costly and time consuming, and thus cannot be compatible with mass production process.

SUMMARY OF THE INVENTION

The invention provides a method of manufacturing a semiconductor device, which can be compatible with mass production process.

The invention provides a method of manufacturing a semiconductor device, which includes the following steps. A substrate is provided. An ion implantation process is performed on the substrate to form doped material layers at different depth positions of the substrate and to define at least one nanowire layer. The at least one nanowire layer and the doped material layers are alternately stacked. A patterning process is performed on the at least one nanowire layer and the doped material layers to form at least one nanowire and doped layers. The at least one nanowire and the doped layers are alternately stacked to form a stack structure. A dummy gate structure spanning over the stack structure is formed. Spacers located on sidewalls of the dummy gate structure are formed. The dummy gate structure is removed to expose the at least one nanowire and the doped layers. The exposed doped layers are removed to form openings.

According to an embodiment of the invention, in the method of manufacturing the semiconductor device, wherein the dopants used in the ion implantation process may be oxygen (O), nitrogen (N), or germanium (Ge).

According to an embodiment of the invention, in the method of manufacturing the semiconductor device, the step of removing the exposed doped layers may be wet etching.

According to an embodiment of the invention, in the method of manufacturing the semiconductor device, the dopants used in the ion implantation process may be oxygen, and an etchant used in the wet etching may be a hydrofluoric acid (HF) or a buffered oxide etchant (BOE).

According to an embodiment of the invention, in the method of manufacturing the semiconductor device, the dopants used in the ion implantation process may be nitrogen, and an etchant used in the wet etching may be a phosphoric acid.

According to an embodiment of the invention, in the method of manufacturing the semiconductor device, the dopants used in the ion implantation process may be germanium, and an etchant used in the wet etching may be a hydrochloric acid or a mixture of HF, $H_2O_2$, and $CH_3COOH$.

According to an embodiment of the invention, in the method of manufacturing the semiconductor device, the doping concentration of each of the doped material layers may be greater than or equal to $10^{18}$ cm$^{-3}$.

According to an embodiment of the invention, in the method of manufacturing the semiconductor device, the doping concentration of each of the doped material layers may be less than or equal to $10^{20}$ cm$^{-3}$.

According to an embodiment of the invention, in the method of manufacturing the semiconductor device, the ion implantation process may be performed on the substrate from deep to shallow.

According to an embodiment of the invention, in the method of manufacturing the semiconductor device, the ion implantation process may be performed on the substrate from shallow to deep.

According to an embodiment of the invention, the method of manufacturing the semiconductor device may further include performing a thermal process after forming the doped material layers.

According to an embodiment of the invention, in the method of manufacturing the semiconductor device, the temperature of the thermal process may range from 1000° C. to 1350° C.

According to an embodiment of the invention, in the method of manufacturing the semiconductor device, the duration of the thermal process is, for example, from 0.5 hour to 5 hours depending on the temperature of the thermal process.

According to an embodiment of the invention, the method of manufacturing the semiconductor device may further include forming isolation structures in the substrate on two sides of the stack structure.

According to an embodiment of the invention, the method of manufacturing the semiconductor device may further include forming two source/drain structures on two sides of the dummy gate structure.

According to an embodiment of the invention, in the method of manufacturing the semiconductor device, the two source/drain structures may be epitaxial layers.

According to an embodiment of the invention, the method of manufacturing the semiconductor device may further include removing a portion of the stack structure on the two sides of the dummy gate structure before forming the two source/drain structures.

According to an embodiment of the invention, the method of manufacturing the semiconductor device may further include forming a metal gate structure in the openings.

According to an embodiment of the invention, in the method of manufacturing the semiconductor device, the material of the substrate may be a semiconductor material.

According to an embodiment of the invention, in the method of manufacturing the semiconductor device, the semiconductor material may be silicon or a group III-V semiconductor material.

Based on the above description, in the method of manufacturing the semiconductor device according to the present invention, the nanowire layer and the doped material layer are alternately formed by performing the ion implantation process on the substrate, and then the patterning process is performed on the nanowire layer to form the nanowire. Therefore, the method of manufacturing the semiconductor device according to the present invention can effectively reduce the process cost and shorten the process time, and thus can be compatible with mass production process.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1M are perspective views and cross-sectional views illustrating various stages of a method of manufacturing a semiconductor device 10 in accordance with an embodiment of the invention.

Figure 1A:
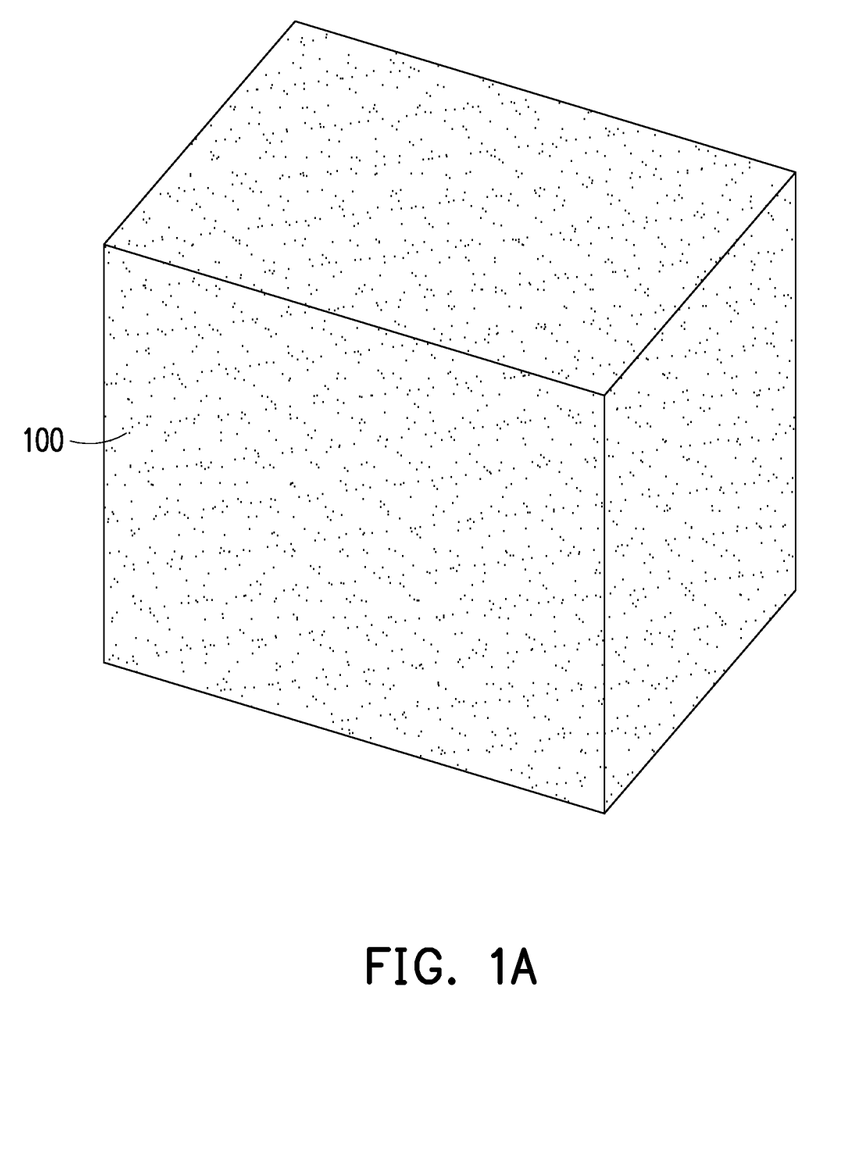
FIG. 1A to FIG. 1M are perspective views and cross-sectional views illustrating various stages of a method of manufacturing a semiconductor device in accordance with an embodiment of the invention.

Referring to FIG. 1A, a substrate 100 is provided. The material of the substrate 100 may be a semiconductor material. The semiconductor material may be silicon or a group III-V semiconductor material. In the present embodiment, the material of the substrate 100 is exemplified by silicon, but the invention is not limited thereto.

Figure 1B:
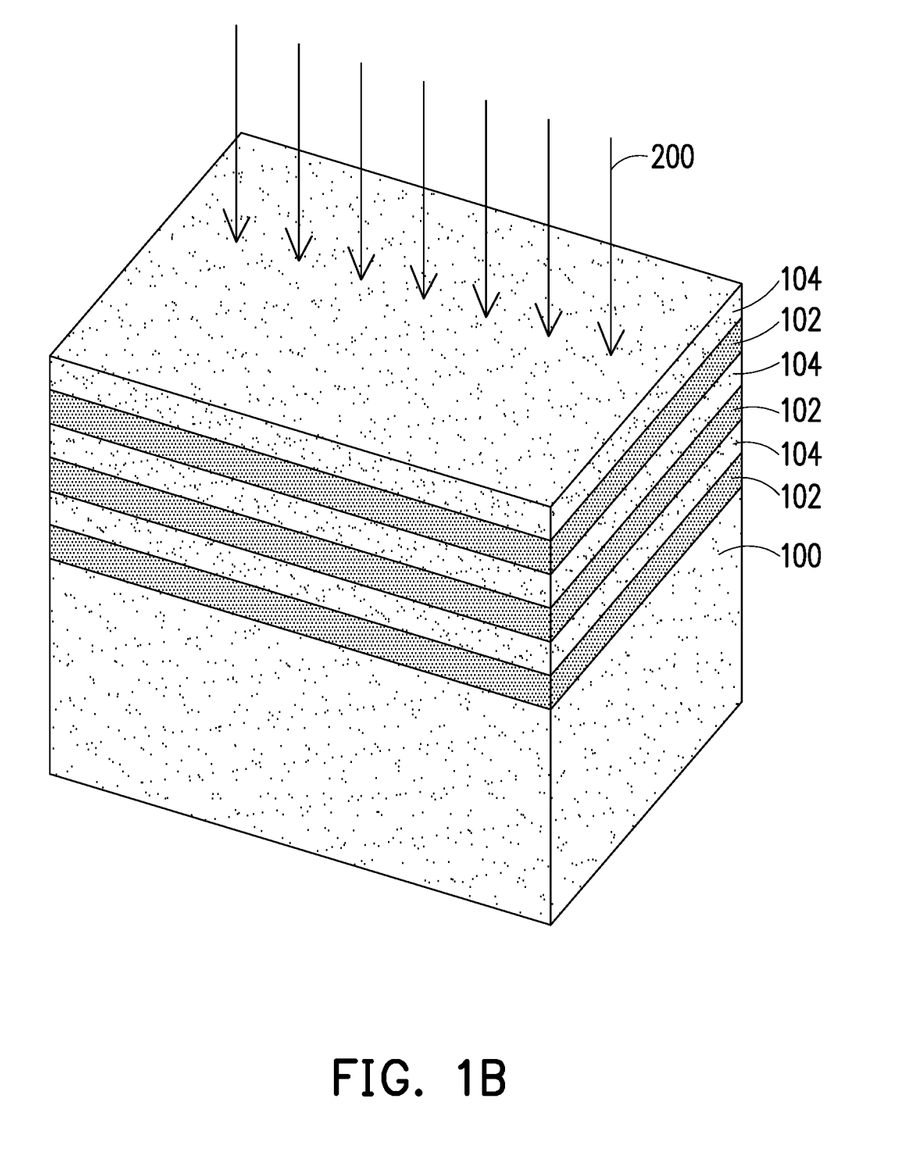

Referring to FIG. 1B, an ion implantation process 200 is performed on the substrate 100 to form doped material layers 102 at different depth positions of the substrate 100 and to define at least one nanowire layer 104. The at least one nanowire layer 104 and the doped material layers 102 are alternately stacked. In the present embodiment, a plurality of nanowire layers 104 will be described as an example. The material of the doped material layers 102 may be the substrate 100 doped with the dopants. The material of the nanowire layers 104 may be the substrate 100 that is not subjected to the ion implantation process 200. The dopants used in the ion implantation process 200 may be oxygen (O), nitrogen (N), or germanium (Ge). The doping concentration of each of the doped material layers 102 may be greater than or equal to $10^{18}$ cm$^{-3}$. Moreover, the doping concentration of each of the doped material layers 102 may be less than or equal to $10^{20}$ cm$^{-3}$. In the present embodiment, the ion implantation process 200 may be performed on the substrate 100 from deep to shallow, but the invention is not limited thereto. In the present embodiment, the substrate 100 may be maintained at 400° C.~800° C. during implantation. In other embodiment, the ion implantation process 200 may be performed on the substrate 100 from shallow to deep.

Figure 1C:
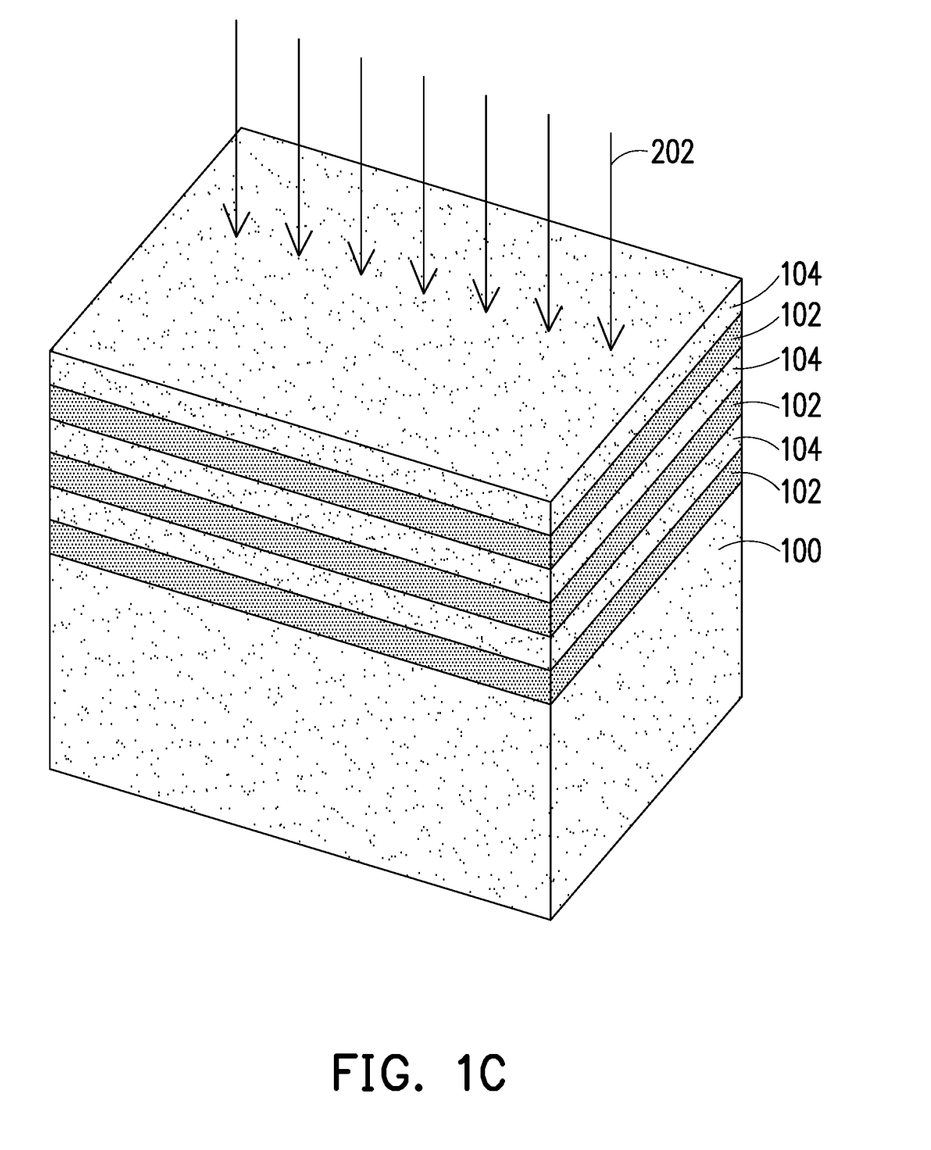

Referring to FIG. 1C, a thermal process 202 may be performed after forming the doped material layers 102. The thermal process 202 may cause a change in the material of the doped material layers 102. In some embodiments, when the dopants used in the ion implantation process 200 is oxygen, and the material of the substrate 100 is silicon, the material of the doped material layers 102 may change from oxygen-doped silicon to silicon oxide after performing the thermal process 202. In some embodiments, when the dopants used in the ion implantation process 200 is nitrogen, and the material of the substrate 100 is silicon, the material of the doped material layers 102 may change from nitrogen-doped silicon to silicon nitride after performing the thermal process 202. In some embodiments, when the dopants used in the ion implantation process 200 is germanium, and the material of the substrate 100 is silicon, the material of the doped material layers 102 may change from germanium-doped silicon to silicon germanium after performing the thermal process 202. The temperature of the thermal process 202 may range from 1000° C. to 1350° C. The duration of the thermal process 202 is, for example, from 0.5 hour to 5 hours depending on the temperature of the thermal process 202. It should be noted that the thermal process 202 illustrated in FIG. 1C may be omitted in some other embodiments.

Figure 1D:
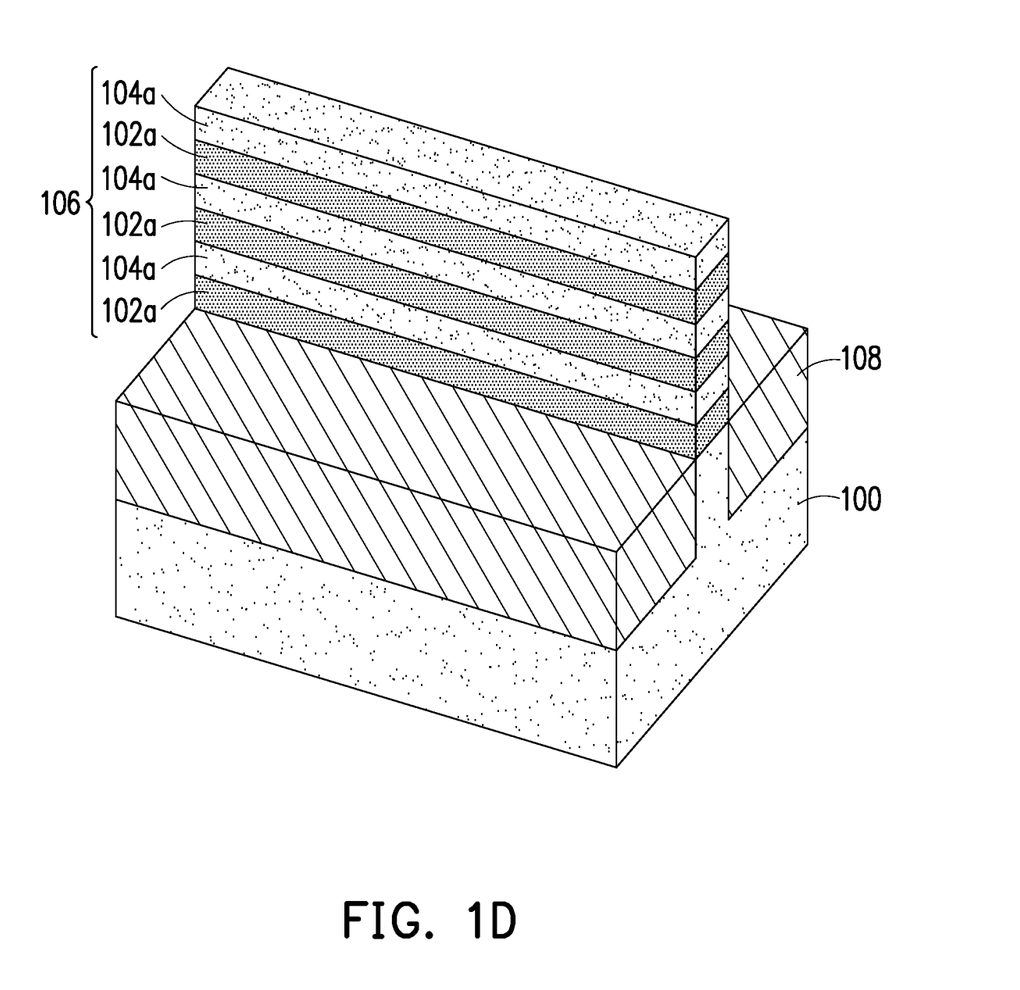

Referring to FIG. 1D, a patterning process is performed on the nanowire layers 104 and the doped material layers 102 to form nanowires 104a and doped layers 102a. The nanowires 104a and the doped layers 102a are alternately stacked to form a stack structure 106. The patterning process performed on the nanowire layers 104 and the doped material layers 102 is, for example, a combination of a lithography process and an etching process.

Furthermore, isolation structures 108 may be formed in the substrate 100 on two sides of the stack structure 106. The material of the isolation structures 108 is, for example, silicon oxide. The isolation structures 108 may be formed by shallow trench isolation (STI) process.

Figure 1E:
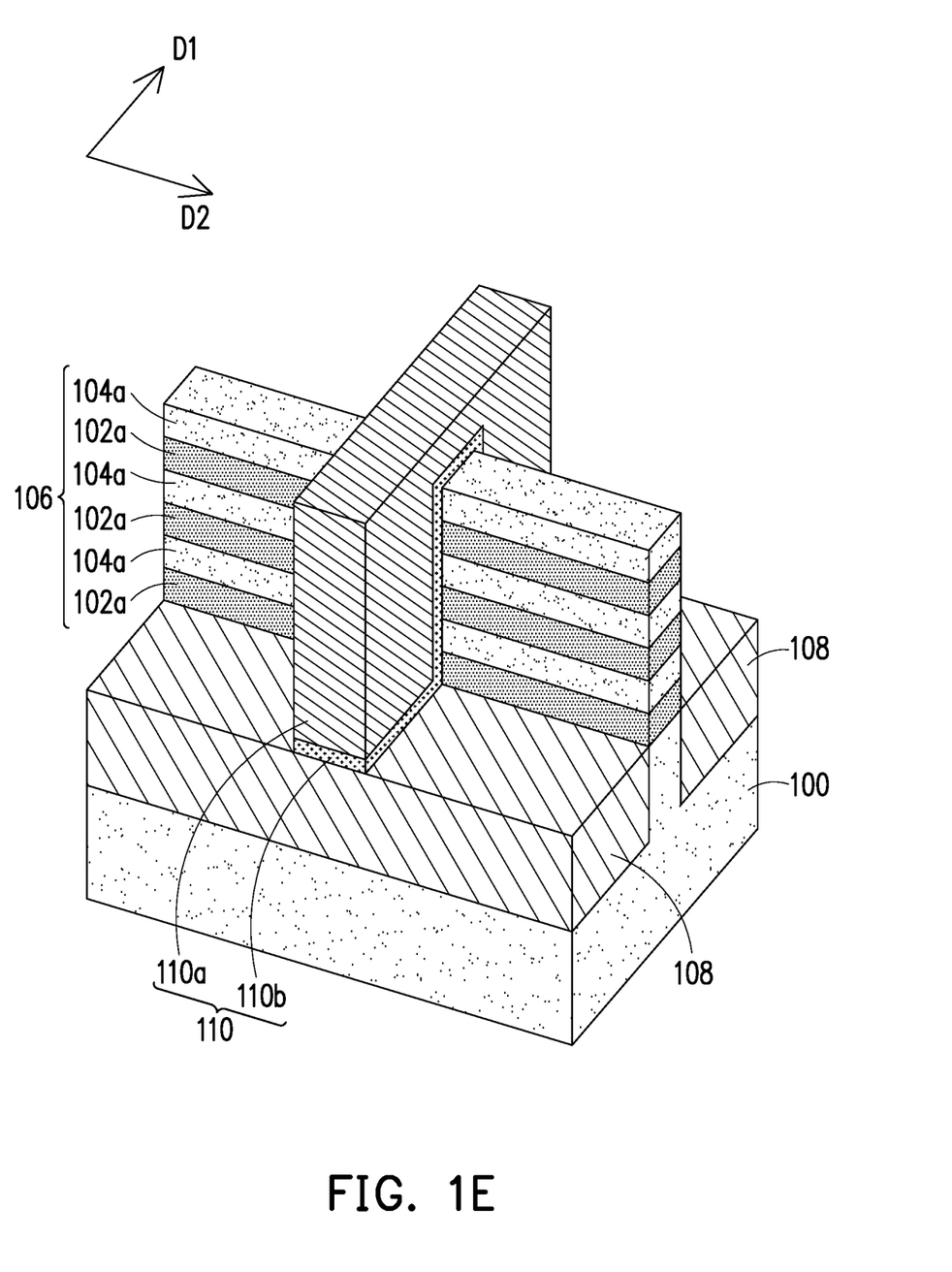

Referring to FIG. 1E, a dummy gate structure 110 spanning over the stack structure 106 is formed. An extending direction D1 of the dummy gate structure 110 may intersect an extending direction D2 of the stack structure 106. For example, the extending direction D1 may be perpendicular to the extending direction D2. The dummy gate structure 110 includes a dummy gate 110a. The material of the dummy gate 110a is, for example, a semiconductor material (e.g., polysilicon). The dummy gate structure 110 may include a dielectric layer 110b. In some embodiments, the dielectric layer 110b may be located between the dummy gate 110a and the stack structure 106 and between the dummy gate 110a and the isolation structures 108. The material of the dielectric layer 110b is, for example, silicon oxide. The dummy gate structure 110 may be formed by a suitable process such as a combination of a deposition process, a lithography process, and an etching process.

Figure 1F:
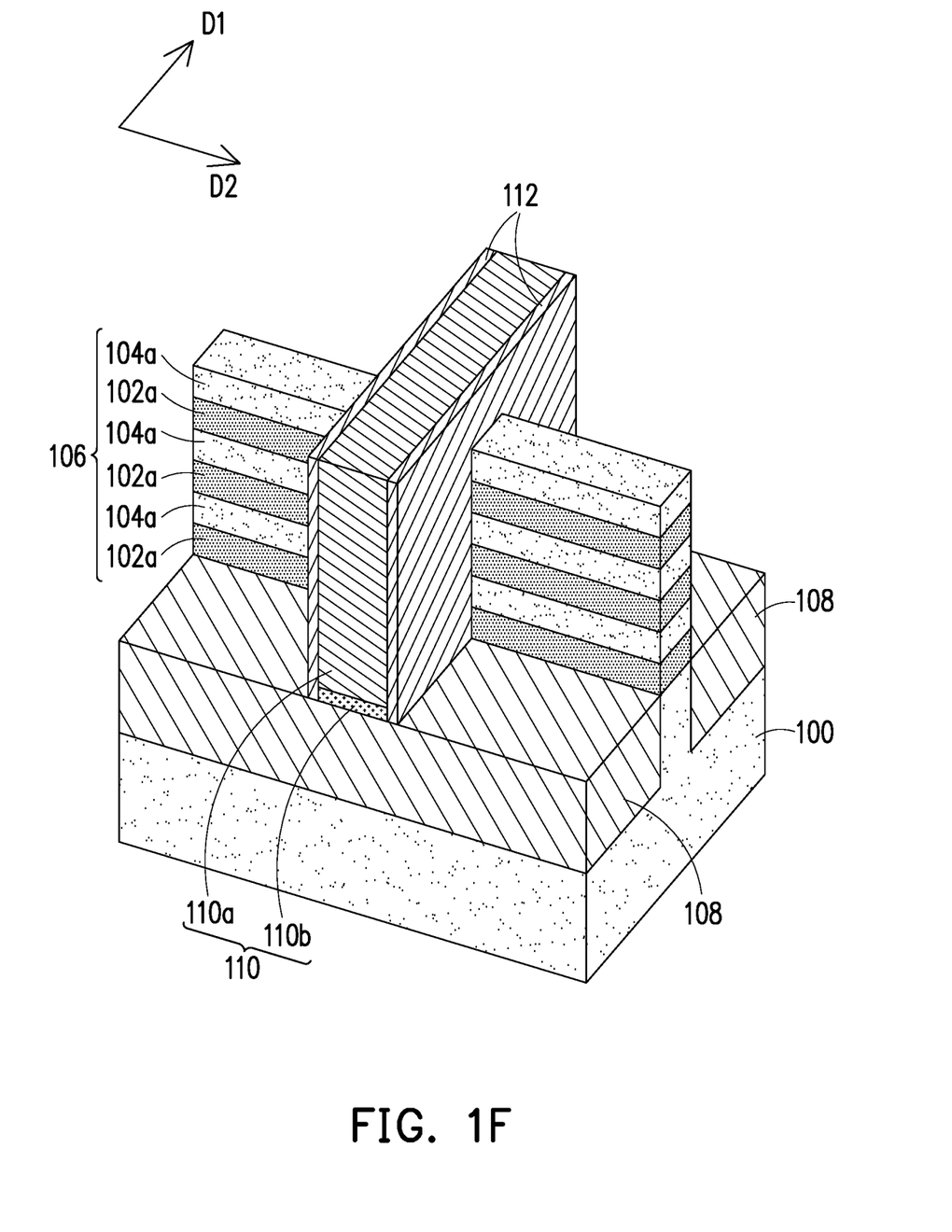

Referring to FIG. 1F, spacers 112 located on sidewalls of the dummy gate structure 110 are formed. The spacers 112 and the dummy gate structure 106 may have the same extending direction D1. The spacers 112 may be formed of dielectric materials, such as silicon oxide, silicon nitride, silicon oxynitride, or a combination thereof. In some embodiments, the spacers 112 may be formed by a deposition or a thermal oxidation followed by an anisotropic etch.

Figure 1G:
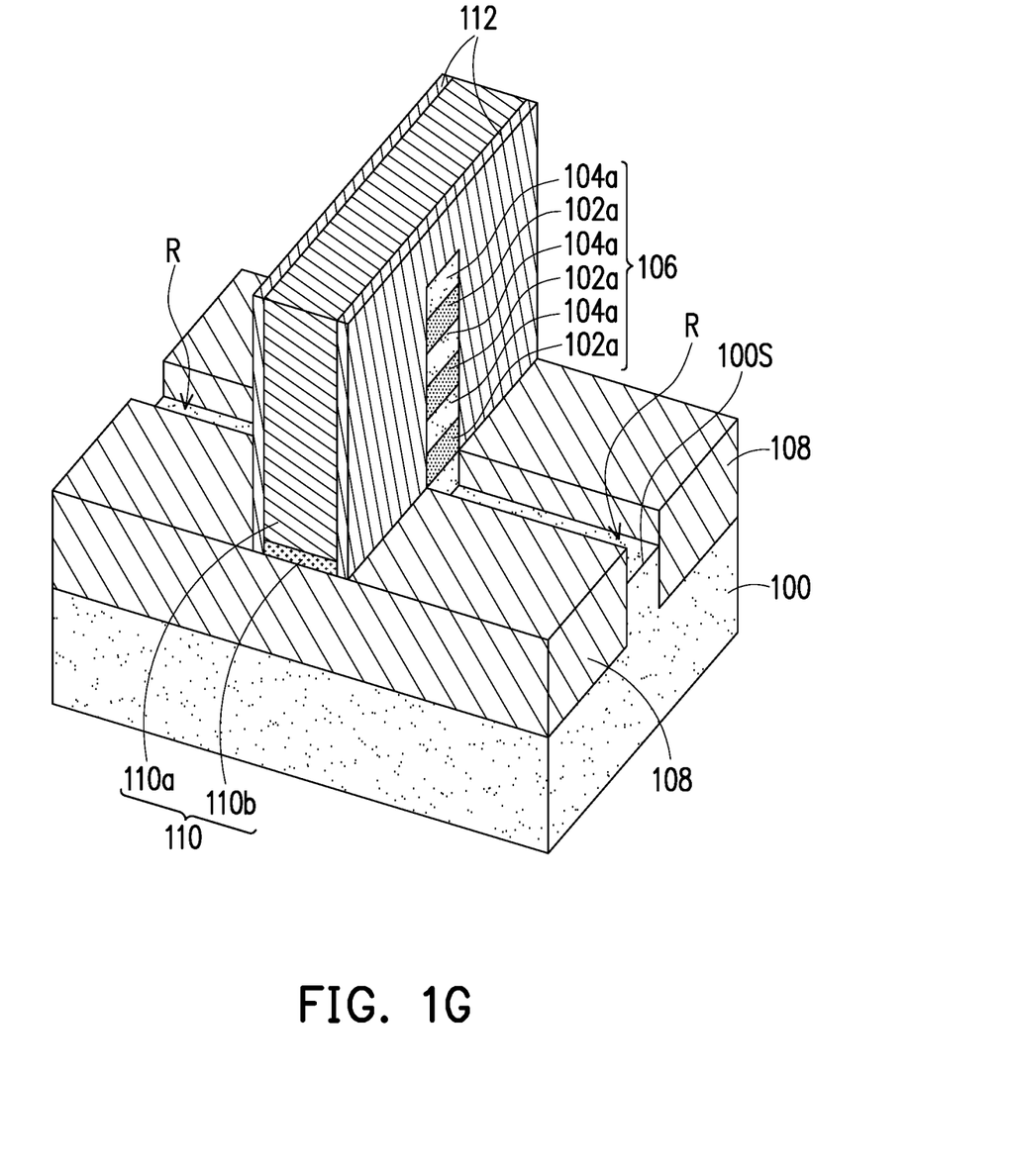

Referring to FIG. 1G, a portion of the stack structure 106 on the two sides of the dummy gate structure 110 is removed. For example, the stack structure 106 exposed by the dummy gate structure 110 and the spacers 112 is removed. The portion of the stack structure 106 may be removed by, for example, wet etching, dry etching, or a combination thereof. In the present embodiment, the top surface 100S of substrate 100 may be recessed during the removal of the portion of the stack structure 106 to form recessed portions R, but the invention is not limited thereto.

Figure 1H:
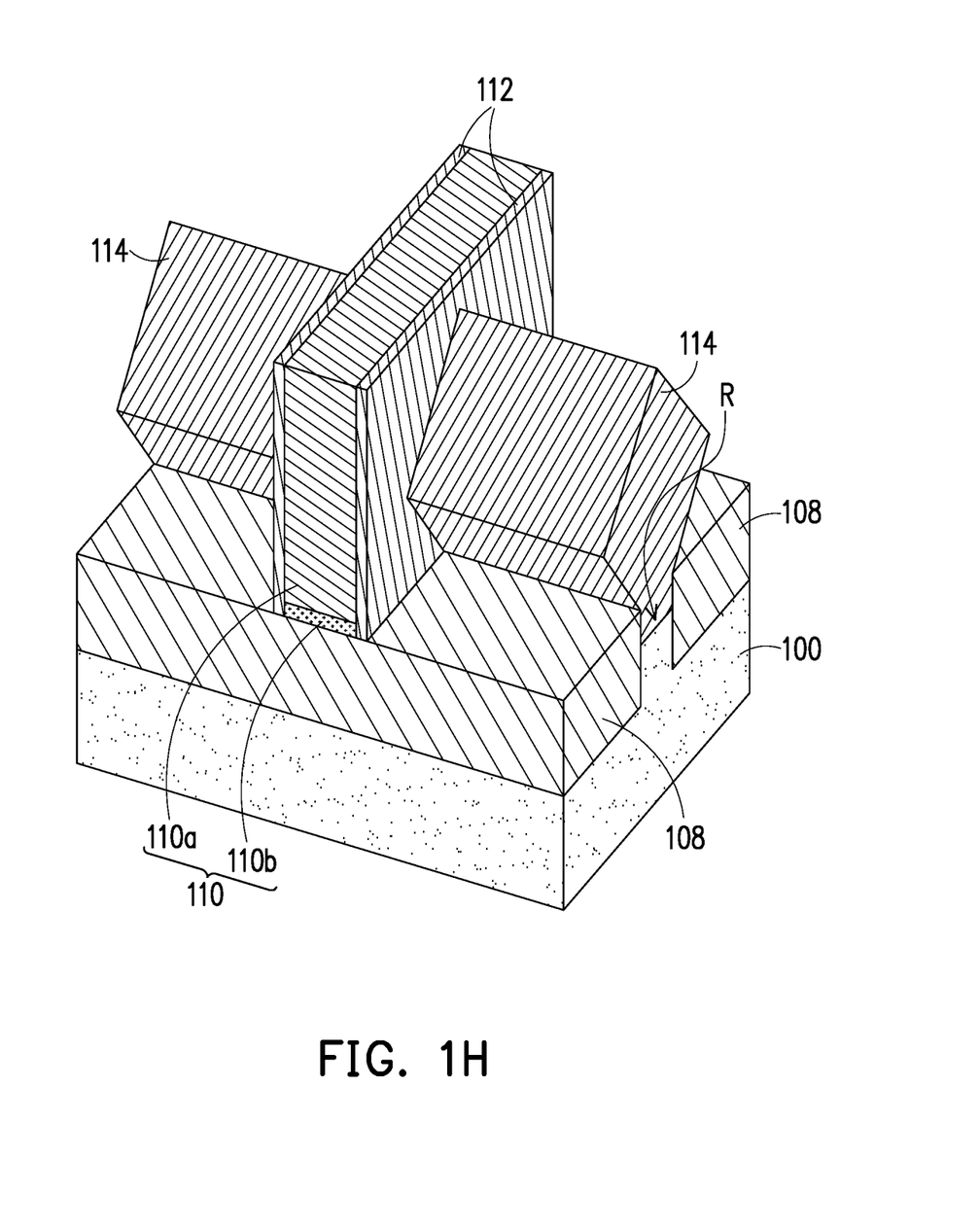

Referring to FIG. 1H, two source/drain structures 114 may be formed on two sides of the dummy gate structure 110. The source/drain structures 114 may be epitaxial layers. The material of the epitaxial layers may be SiGe, SiGeB, GeSn, SiC, SiP, SiCP, a combination of SiC/SiP, or the like. In some embodiments, the source/drain structures 114 may be doped with a conductive dopant. For example, the source/drain structures 114 may be epitaxial-grown with dopants over the recessed portions R. It should be noted that the recess step illustrated in FIG. 1G may be omitted in some other embodiments. For example, the source/drain structures 114 may be formed on the un-recessed substrate 100.

Figure 1I:
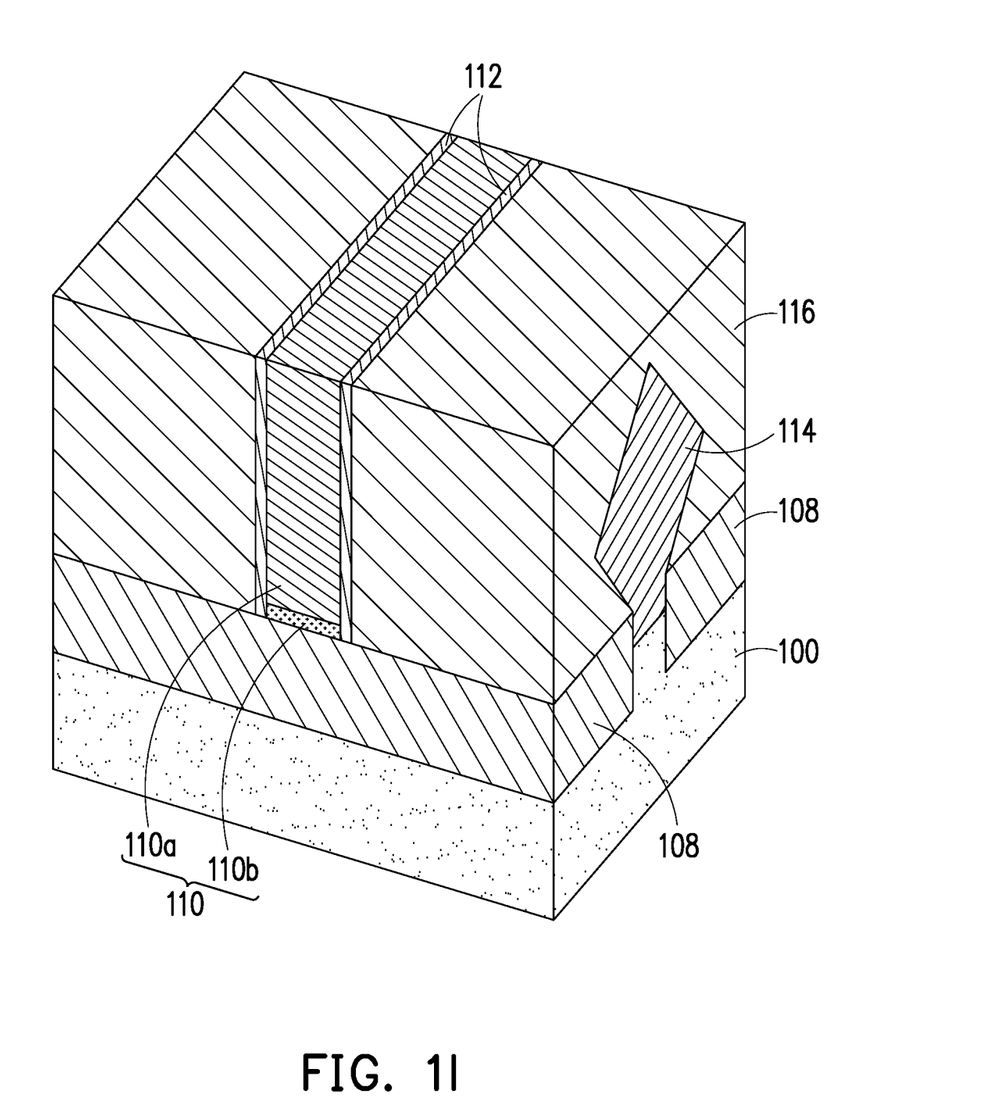

Referring to FIG. 1I, an interlayer dielectric (ILD) layer 116 may be formed over the dummy gate structure 110, the spacers 112, the source/drain structures 114, and the isolation structures 108. The ILD layer 116 may be formed by a chemical vapor deposition method. The ILD layer 116 may be formed from any well-known dielectric material, such as silicon oxide, silicon nitride, or silicon oxynitride. A portion of the ILD layer 116 is then removed to expose the top of the dummy gate structure 110 and the top of the spacers 112. The method of removing the portion of the ILD layer 116 is, for example, a chemical mechanical planarization (CMP) method.

Figure 1J:
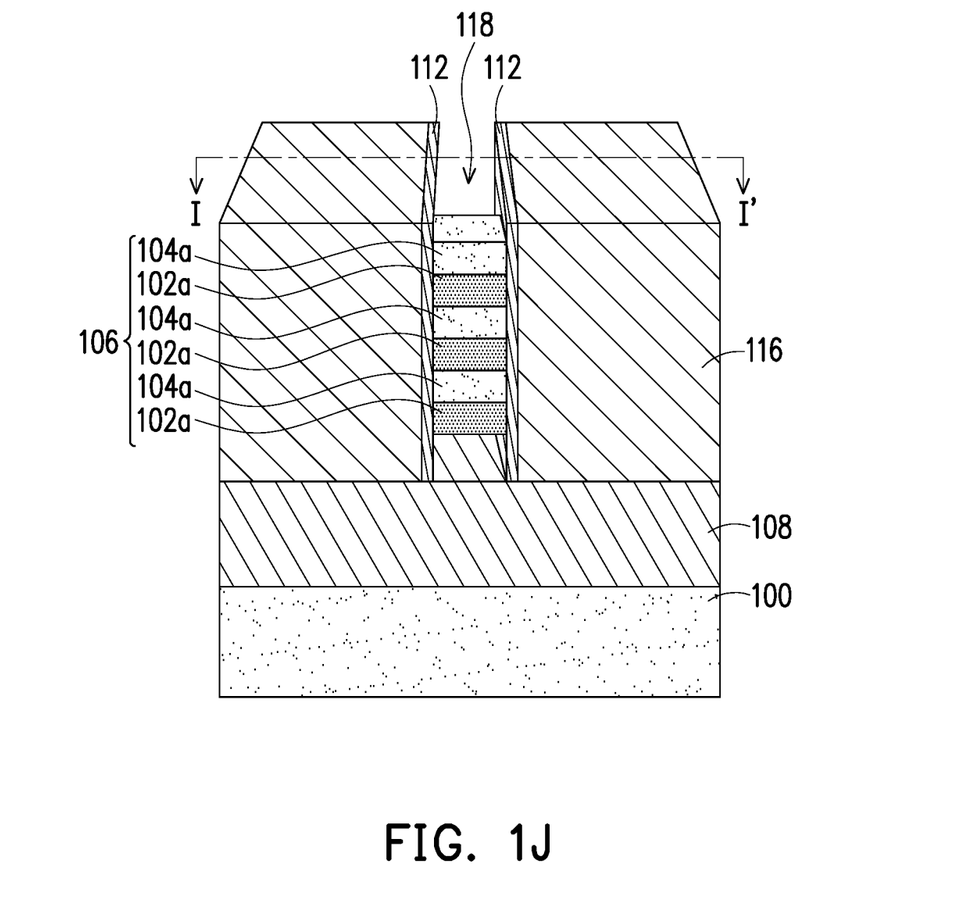
Figure 1K:
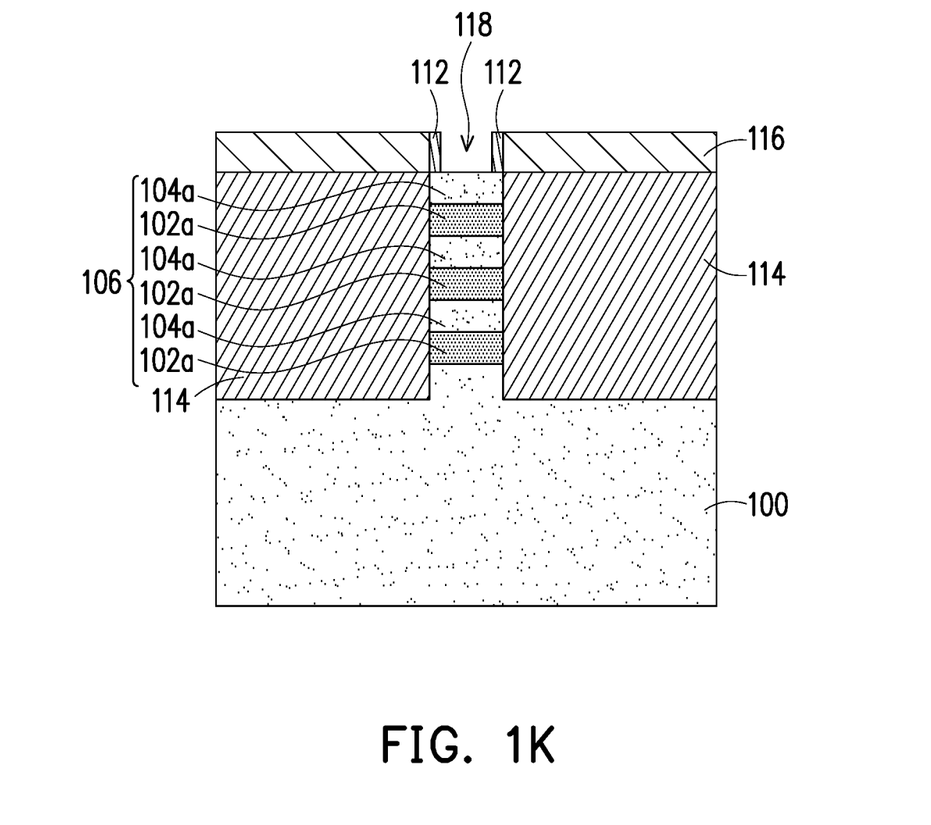

FIG. 1J is a perspective view illustrating one of various stages of the method of manufacturing the semiconductor device 10 in accordance with an embodiment of the invention. FIG. 1K is a cross-sectional view taken along a sectional line I-I' depicted in FIG. 1J. Referring to FIG. 1J and FIG. 1K, the dummy gate structure 110 is removed to expose the nanowires 104a and the doped layers 102a. Thereby, an opening 118 may be formed between the spacers 112. The dummy gate 110a of the dummy gate structure 110 may be removed by dry etching, wet etching, or a combination thereof. The dielectric layer 110b of the dummy gate structure 110 may be removed by wet etching.

Figure 1L:
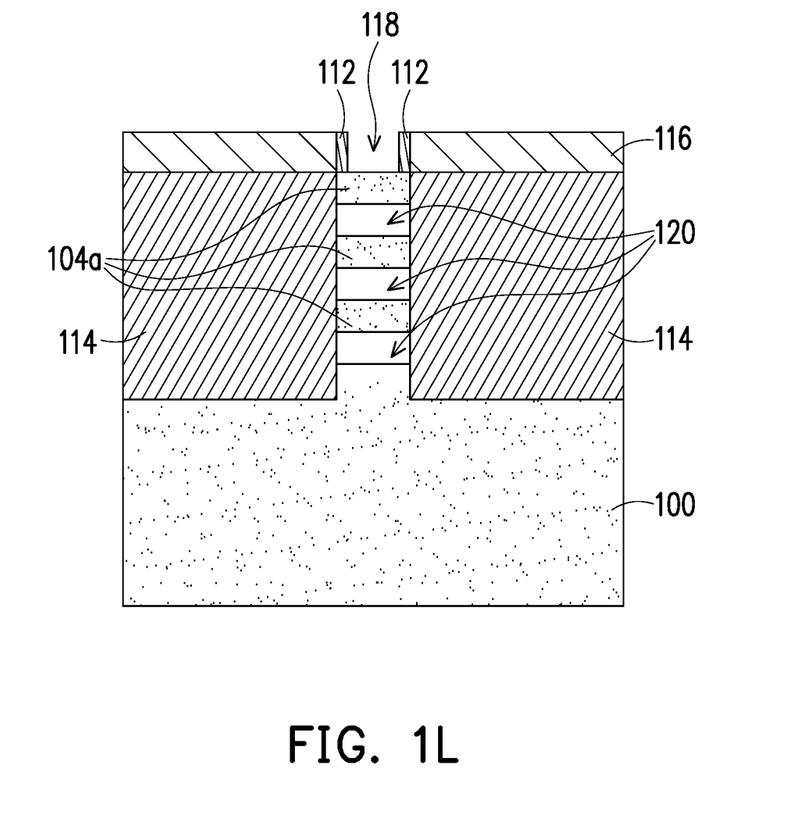

Referring to FIG. 1L, the exposed doped layers 102a are removed to form openings 120. The step of removing the exposed doped layers 102a may be wet etching. In some embodiments, the dopants used in the ion implantation process 200 of FIG. 1B may be oxygen, and an etchant used in the wet etching may be a hydrofluoric acid (HF) or a buffered oxide etchant (BOE). For example, when the material of the doped layers 102a is oxygen-doped silicon or silicon oxide, the doped layers 102a may be removed by the HF or the BOE. In some embodiments, the dopants used in the ion implantation process 200 of FIG. 1B may be nitrogen, and an etchant used in the wet etching may be a phosphoric acid. For example, when the material of the doped layers 102a is nitrogen-doped silicon or silicon nitride, the doped layers 102a may be removed by the phosphoric acid. In some embodiments, the dopants used in the ion implantation process 200 of FIG. 1B may be germanium, and an etchant used in the wet etching may be a hydrochloric acid or a mixture of HF, $H_2O_2$, and $CH_3COOH$. For example, when the material of the doped layers 102a is germanium-doped silicon or silicon germanium, the doped layers 102a may be removed by the hydrochloric acid or the mixture of HF, $H_2O_2$, and $CH_3COOH$.

Figure 1M:
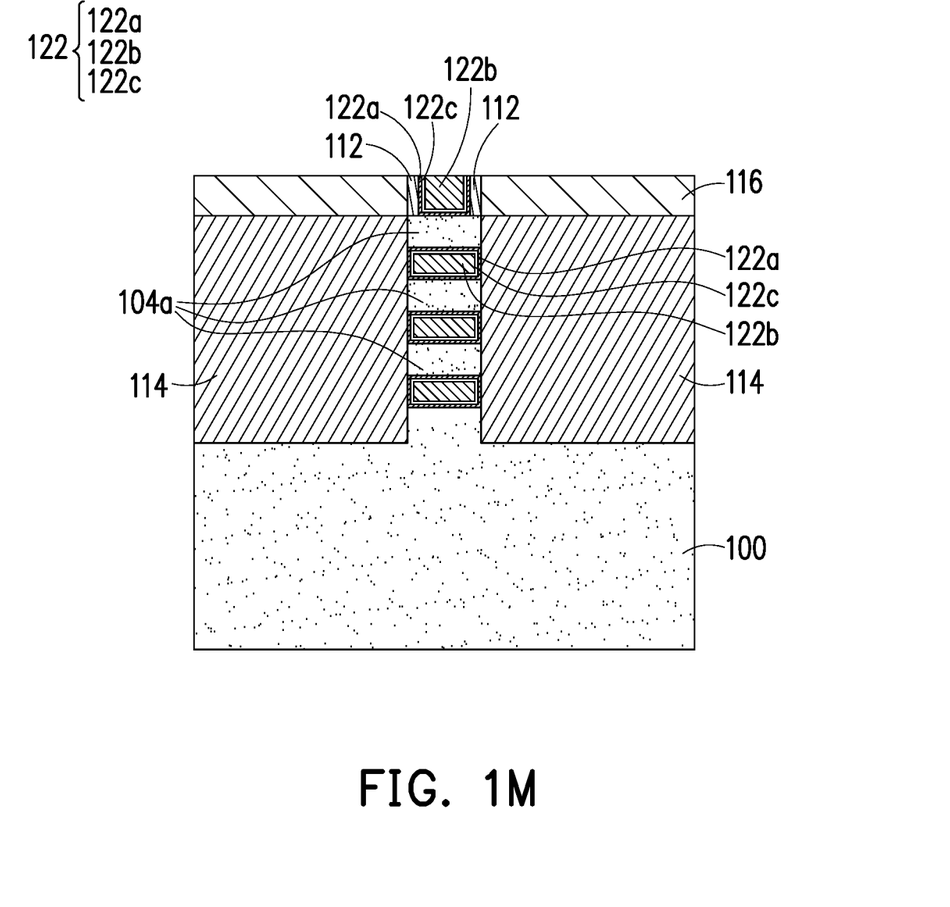

Referring to FIG. 1M, a metal gate structure 122 is formed in the openings 120. Moreover, the metal gate structure 122 may be further formed in the opening 118. Thereby, the metal gate structure 122 can surround the nanowires 104a. The metal gate structure 122 may include a gate dielectric 122a and a metal layer 122b. The gate dielectric 122a surrounds each nanowire 104a. The gate dielectric 122a may be a gate dielectric layer or a stack of gate dielectric layers (e.g., a stack of a high-k dielectric layer and an interface layer). The metal layer 122b is located on the gate dielectric 122a and surrounds each nanowire 104a. Furthermore, the metal gate structure 122 may further include a work function layer 122c. The work function layer 122c is located between the gate dielectric 122a and the metal layer 122b. The method of forming the metal gate structure 122 may include the following steps, but the invention is not limited thereto. A gate dielectric material (not shown), a work function material layer (not shown), and a metal material layer (not shown) are sequentially formed in the opening 118 and the opening 120. A portion of the metal material layer, a portion of the work function material layer, and a portion of the gate dielectric material are removed to expose the top of the ILD layer 116 and the top of the spacers 112 and to form the metal layer 122b, the work function layer 122c, and the gate dielectric 122a.

In the present embodiment, the above-mentioned method may be used to form the semiconductor device 10. The semiconductor device 10 may be an N-type metal oxide semiconductor (NMOS) transistor or a P-type metal oxide semiconductor (PMOS) transistor.

Based on the above embodiments, in the manufacturing method of the semiconductor device 10, the nanowire layer 104 and the doped material layer 102 are alternately formed by performing the ion implantation process 200 on the substrate 100, and then the patterning process is performed on the nanowire layer 104 to form the nanowire 104a. Therefore, the method of manufacturing the semiconductor device 10 can effectively reduce the process cost and shorten the process time, and thus can be compatible with mass production process.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A method of manufacturing a semiconductor device, comprising:
   providing a substrate;
   performing an ion implantation process on the substrate to form doped material layers at different depth positions of the substrate and to define at least one nanowire layer, wherein the at least one nanowire layer and the doped material layers are alternately stacked;
   performing a patterning process on the at least one nanowire layer and the doped material layers to form at least one nanowire and doped layers, wherein the at least one nanowire and the doped layers are alternately stacked to form a stack structure;
   forming a dummy gate structure spanning over the stack structure;
   forming spacers located on sidewalls of the dummy gate structure;
   removing the dummy gate structure to expose the at least one nanowire and the doped layers; and
   removing the exposed doped layers to form openings.

2. The method of manufacturing the semiconductor device according to claim 1, wherein dopants used in the ion implantation process comprise oxygen, nitrogen, or germanium.

3. The method of manufacturing the semiconductor device according to claim 2, wherein the step of removing the exposed doped layers comprises wet etching.

4. The method of manufacturing the semiconductor device according to claim 3, wherein the dopants used in the ion implantation process are oxygen, and an etchant used in the wet etching comprises a hydrofluoric acid or a buffered oxide etchant.

5. The method of manufacturing the semiconductor device according to claim 3, wherein the dopants used in the ion implantation process are nitrogen, and an etchant used in the wet etching comprises a phosphoric acid.

6. The method of manufacturing the semiconductor device according to claim 3, wherein the dopants used in the ion implantation process are germanium, and an etchant used in the wet etching comprises a hydrochloric acid or a mixture of HF, $H_2O_2$, and $CH_3COOH$.

7. The method of manufacturing the semiconductor device according to claim 1, wherein a doping concentration of each of the doped material layers is greater than or equal to $10^{18}$ $cm^{-3}$.

8. The method of manufacturing the semiconductor device according to claim 7, wherein the doping concentration of each of the doped material layers is less than or equal to $10^{20}$ $cm^{-3}$.

9. The method of manufacturing the semiconductor device according to claim 1, wherein the ion implantation process is performed on the substrate from deep to shallow.

10. The method of manufacturing the semiconductor device according to claim 1, wherein the ion implantation process is performed on the substrate from shallow to deep.

11. The method of manufacturing the semiconductor device according to claim 1, further comprising:
performing a thermal process after forming the doped material layers.

12. The method of manufacturing the semiconductor device according to claim 11, wherein a temperature of the thermal process ranges from 1000° C. to 1350° C.

13. The method of manufacturing the semiconductor device according to claim 11, wherein a duration of the thermal process is from 0.5 hour to 5 hours depending on a temperature of the thermal process.

14. The method of manufacturing the semiconductor device according to claim 1, further comprising:
forming isolation structures in the substrate on two sides of the stack structure.

15. The method of manufacturing the semiconductor device according to claim 1, further comprising:
forming two source/drain structures on two sides of the dummy gate structure.

16. The method of manufacturing the semiconductor device according to claim 15, wherein the two source/drain structures comprise epitaxial layers.

17. The method of manufacturing the semiconductor device according to claim 16, further comprising:
removing a portion of the stack structure on the two sides of the dummy gate structure before forming the two source/drain structures.

18. The method of manufacturing the semiconductor device according to claim 1, further comprising:
forming a metal gate structure in the openings.

19. The method of manufacturing the semiconductor device according to claim 1, wherein a material of the substrate comprises a semiconductor material.

20. The method of manufacturing the semiconductor device according to claim 19, wherein the semiconductor material comprises silicon or a group III-V semiconductor material.

* * * * *